United States Patent
Rasheed et al.

(10) Patent No.: US 10,704,147 B2
(45) Date of Patent: Jul. 7, 2020

(54) PROCESS KIT DESIGN FOR IN-CHAMBER HEATER AND WAFER ROTATING MECHANISM

(71) Applicant: APPLIED MATERIALS, INC., Santa Clara, CA (US)

(72) Inventors: Muhammad M. Rasheed, San Jose, CA (US); Muhannad Mustafa, Santa Clara, CA (US); Hamid Tavassoli, Cupertino, CA (US); Steven V Sansoni, Livermore, CA (US); Cheng-Hsiung Tsai, Cupertino, CA (US); Vikash Banthia, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 341 days.

(21) Appl. No.: 15/421,964

(22) Filed: Feb. 1, 2017

(65) Prior Publication Data

US 2018/0155838 A1    Jun. 7, 2018

Related U.S. Application Data

(60) Provisional application No. 62/429,781, filed on Dec. 3, 2016.

(51) Int. Cl.
*C23C 16/00* (2006.01)
*C23C 16/46* (2006.01)
(Continued)

(52) U.S. Cl.
CPC .......... *C23C 16/46* (2013.01); *C23C 16/4584* (2013.01); *C23C 16/4586* (2013.01);
(Continued)

(58) Field of Classification Search
CPC ......... H01J 37/32642; H01L 21/68785; H01L 21/69735
See application file for complete search history.

(56) References Cited

U.S. PATENT DOCUMENTS

| | | | |
|---|---|---|---|
| 5,484,486 A * | 1/1996 | Blackburn | H01J 37/32642 118/715 |
| 5,632,873 A | 5/1997 | Stevens et al. | |

(Continued)

FOREIGN PATENT DOCUMENTS

EP    1308989 A2    5/2003

OTHER PUBLICATIONS

International Search Report and Written Opinion dated Mar. 19, 2018 for PCT Application No. PCT/US 2017/063844.

*Primary Examiner* — Keath T Chen
(74) *Attorney, Agent, or Firm* — Moser Taboada; Alan Taboada (57) ABSTRACT

Embodiments of the present disclosure are directed process kits for use with an in-chamber heater and substrate rotating mechanism. In some embodiments consistent with the present disclosure, a process kit for use with a rotatable substrate support heater pedestal for supporting a substrate in a process chamber may include an upper edge ring including a top ledge and a skirt the extends downward from the top ledge, a lower edge ring that at least partially supports the upper edge ring and aligns the upper edge ring with the substrate support heater pedestal, a bottom plate disposed on a bottom of the process chamber that supports the upper edge ring when the substrate support heater pedestal is in a lowered non-processing position, and a shadow ring that couples with the upper edge ring when the substrate support heater pedestal is in a raised processing position.

20 Claims, 8 Drawing Sheets

(51) Int. Cl.
*C23C 16/458* (2006.01)
*H01L 21/687* (2006.01)
*H01L 21/67* (2006.01)
*H01L 21/683* (2006.01)

(52) U.S. Cl.
CPC .. *H01L 21/67103* (2013.01); *H01L 21/67248* (2013.01); *H01L 21/68735* (2013.01); *H01L 21/68742* (2013.01); *H01L 21/68785* (2013.01); *H01L 21/6831* (2013.01)

(56) References Cited

U.S. PATENT DOCUMENTS

| | | | | |
|---|---|---|---|---|
| 5,968,379 | A * | 10/1999 | Zhao | C23C 16/45565 118/723 I |
| 6,521,292 | B1 | 2/2003 | Yudovsky et al. | |
| 6,537,422 | B2 * | 3/2003 | Sakuma | C23C 16/46 118/724 |
| 6,744,018 | B2 * | 6/2004 | Takano | H01L 21/67248 118/50.1 |
| 7,138,606 | B2 * | 11/2006 | Kanno | H01L 21/67109 219/390 |
| 2003/0094773 | A1 | 5/2003 | Lerner | |
| 2003/0155072 | A1 * | 8/2003 | Lee | C30B 31/12 156/345.24 |
| 2003/0173031 | A1 | 9/2003 | Aggarwal et al. | |
| 2003/0180127 | A1 | 9/2003 | Kuroda | |
| 2005/0269030 | A1 * | 12/2005 | Kent | H01L 21/67178 156/345.31 |
| 2007/0051472 | A1 * | 3/2007 | Murakami | H01J 37/32642 156/345.51 |
| 2009/0120368 | A1 | 5/2009 | Lubomirsky et al. | |
| 2009/0209112 | A1 * | 8/2009 | Koelmel | H01L 21/68742 438/795 |
| 2011/0031111 | A1 * | 2/2011 | Kobayashi | H01J 37/32623 204/192.34 |
| 2014/0165915 | A1 * | 6/2014 | Raj | H01L 21/67103 118/725 |

* cited by examiner

PROCESS KIT DESIGN FOR IN-CHAMBER HEATER AND WAFER ROTATING MECHANISM

CROSS-REFERENCE TO RELATED APPLICATIONS

This application claims benefit of U.S. provisional patent application Ser. No. 62/429,781, filed Dec. 3, 2016, which is herein incorporated by reference in its entirety.

FIELD

The present disclosure relates generally to apparatus and methods for improving deposition uniformity. In particular, embodiments of the disclosure are directed to a process kit design for an in-chamber heater and substrate rotating mechanism.

BACKGROUND

In many deposition chambers, both atomic layer deposition and chemical vapor deposition, rotating pedestal/heaters are used to improve non-uniformity. In most cases, non-uniformity comes from non-uniform chemical delivery, flow distribution, chamber features, and temperature non-uniformity from the chamber body and surrounding components. Using a rotating pedestal can distribute the local effect of these variations and improve the non-uniformity.

However, in some cases, non-uniformity can be contributed by the pedestal or the heater itself, especially when the substrate (wafer) sits on or contacts the heater. The impact of local non-uniform temperature distribution can have a significant impact on the uniformity of deposition. This non-uniform temperature distribution can come from heater element layout, local features like lift pin holes, non-uniform radiative heat loss, non-uniform contact surface or gap, or other reasons.

Therefore, there is a need in the art for apparatus and methods to eliminate or reduce local non-uniform temperature distribution resulting from pedestal/heater to substrate contact.

SUMMARY

Embodiments of the present disclosure are directed process kits for use with an in-chamber heater and substrate rotating mechanism. In some embodiments consistent with the present disclosure, a process kit for use with a rotatable substrate support heater pedestal for supporting a substrate in a process chamber may include an upper edge ring including a top ledge and a skirt the extends downward from the top ledge, a lower edge ring that at least partially supports the upper edge ring and aligns the upper edge ring with the substrate support heater pedestal, a bottom plate disposed on a bottom of the process chamber that supports the upper edge ring when the substrate support heater pedestal is in a lowered non-processing position, and a shadow ring that couples with the upper edge ring when the substrate support heater pedestal is in a raised processing position.

In some embodiments, a process kit includes an upper edge ring including a top ledge and a skirt the extends downward from the top ledge, wherein the top ledge of the upper edge ring is configured to support the substrate in a spaced-apart relation to a support surface of the substrate support heater pedestal to facilitate repositioning of the substrate relative to the support surface of the substrate support heater pedestal, and wherein the skirt covers the outer edges of the substrate support heater pedestal to prevent heat loss from the substrate support heater pedestal, and a lower edge ring that at least partially supports the upper edge ring and aligns the upper edge ring with the substrate support heater pedestal.

In some embodiments, a rotatable substrate support heater pedestal and process kit for supporting a substrate in a process chamber includes a primary substrate support having a support surface to support the substrate during processing, where the substrate support heater pedestal includes a shaft connected to an actuator to move the substrate support heater pedestal vertically and rotationally about an axis of the shaft, and a process kit comprising an upper edge ring including a top ledge and a skirt the extends downward from the top ledge, wherein the top ledge of the upper edge ring is configured to support the substrate in a spaced-apart relation to a support surface of the substrate support heater pedestal to facilitate repositioning of the substrate relative to the support surface of the substrate support heater pedestal, and a lower edge ring that at least partially supports the upper edge ring and aligns the upper edge ring with the substrate support heater pedestal.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure are directed process kits for use with an in-chamber heater and substrate rotating mechanism. In some embodiments consistent with the present disclosure, a substrate will be decoupled from the heater pedestal substrate support using an upper edge ring while the heater pedestal is lowered. In some embodiments, a skirt of the upper edge ring will remain on a bottom plate and the substrate will sit on a ledge of the upper edge ring. After rotating the decoupled heater pedestal with respect to the substrate, the heater pedestal can be raised to a processing position to chuck the substrate again. The process kit also includes a lower edge ring that can be aligned with upper edge ring during substrate and heater pedestal coupling stage. The process kit may further include a bottom plate that will act as a base support for the upper edge ring ensuring minimum contact with upper edge ring skirt. The bottom plate will also provide centering features to center the bottom plate relative to chamber body and pumping liner. The process kit may further include a shadow ring that can be coupled with upper edge ring and aligned with alignment pins at a processing position of the heater pedestal. In some embodiments, the shadow ring also has alignment tabs to center the shadow ring relative to pumping liner. The inventive process kits consistent with the present disclosure described herein advantageously facilitates decoupling of heater pedestal with respect to the substrate to facilitate in chamber rotation of the heater pedestal with respect to the substrate to eliminate or reduce local non-uniform temperature distribution resulting from pedestal/heater to substrate contact.

Figure 1:
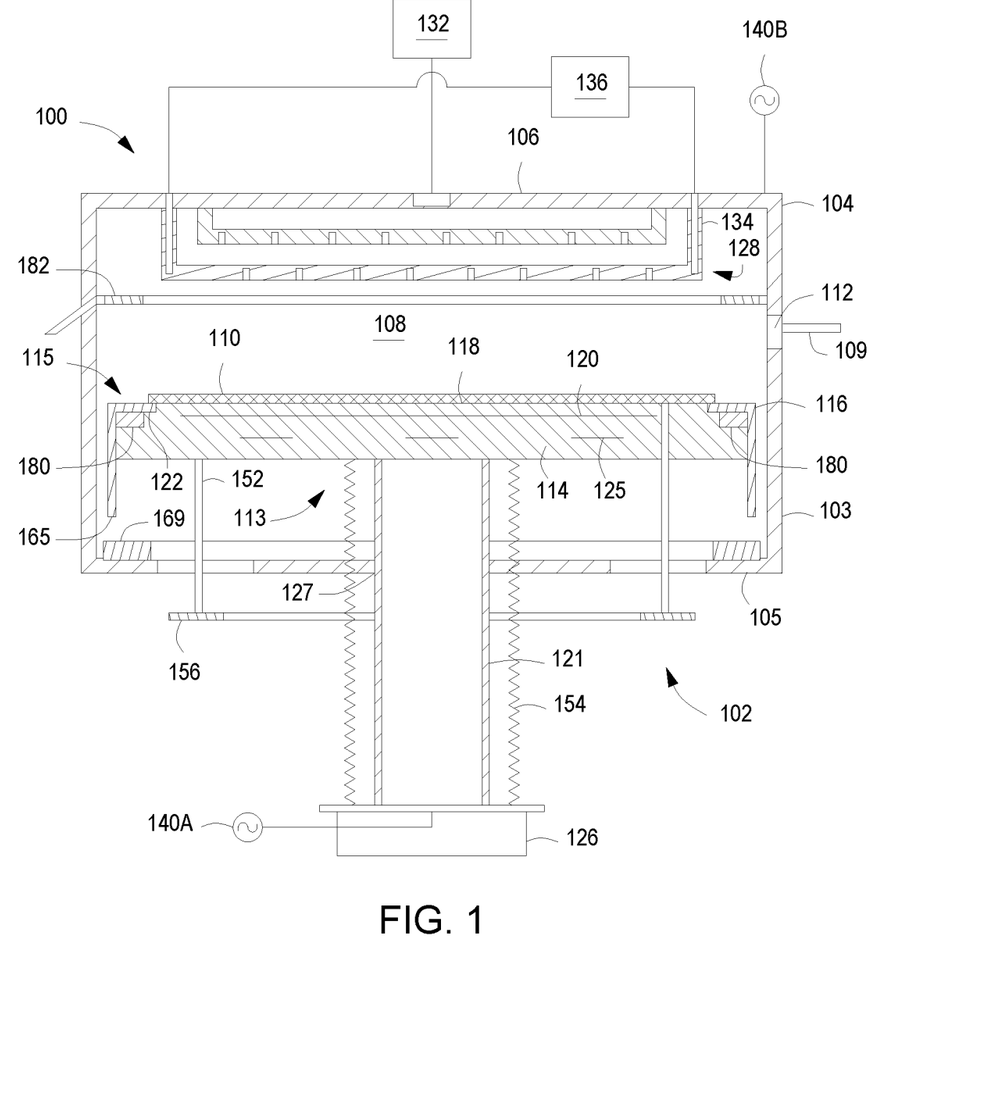
FIG. 1 shows a side cross-sectional view of a processing chamber in accordance with one or more embodiment of the disclosure.

FIG. 1 depicts a side cross-sectional view of a process chamber 100 in accordance with one or more embodiment of the disclosure. The process chamber 100 includes a chamber body 104 with a sidewall 103, a bottom 105 and a lid assembly 106 that encloses a process volume 108. The substrate support system 102 is at least partially disposed in the process volume 108 and can support a substrate 110 that has been transferred to the process volume 108 through a port 112 formed in the chamber body 104. A process kit is included in the processing volume 108 that includes at least one of an upper edge ring 116, a lower edge ring 180, a bottom plate 169, and/or a shadow ring 182.

The substrate support system 102 includes a primary substrate support 113, such as a pedestal 114 and a thermal element 120. In addition, portions of the process kit comprise a secondary substrate support 115, such as an upper edge ring 116 and lower edge ring 180. The secondary substrate support 115 may be used to intermittently support the substrate 110 above the primary substrate support 113. The pedestal 114 includes a support surface 118 that is adapted to contact (or be in proximity to) a major surface of the substrate 110 during processing. Thus, the pedestal 114 serves as a primary supporting structure for the substrate 110 in the process chamber 100.

Figure 2:
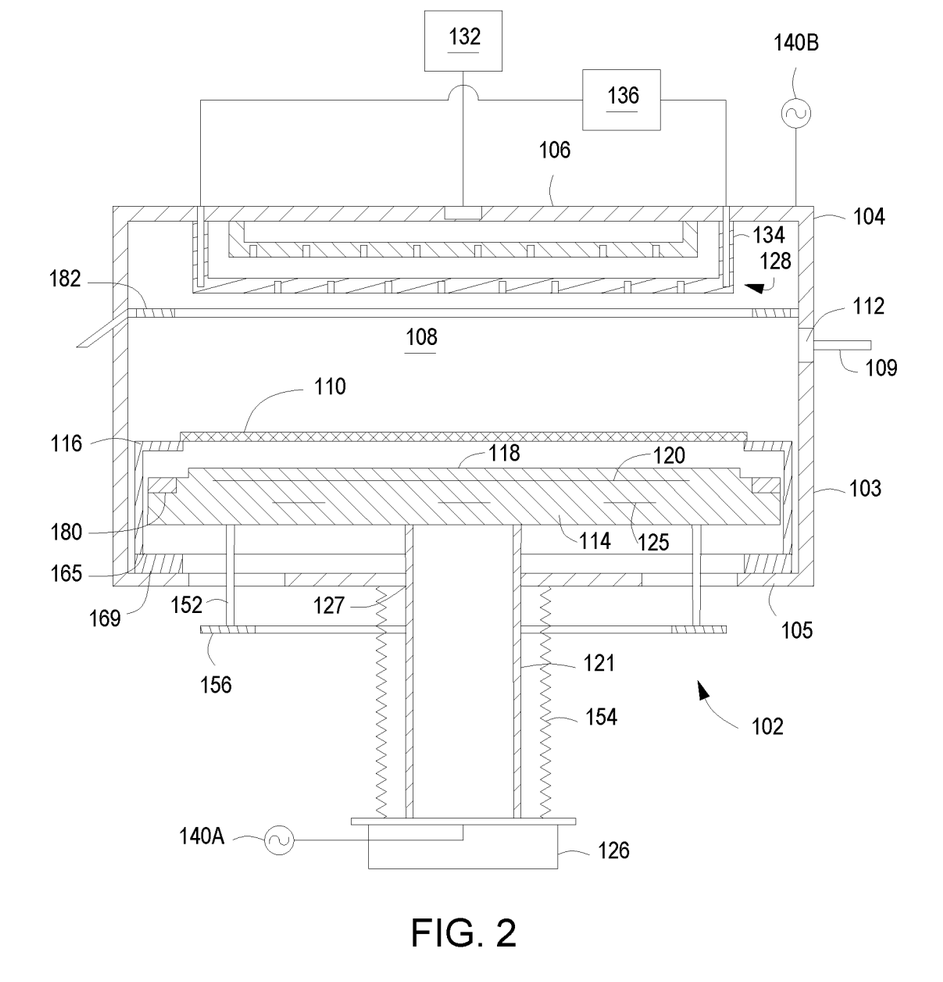
FIG. 2 shows a partial side cross-sectional view of a processing chamber in accordance with one or more embodiment of the disclosure.

The pedestal 114 may include a thermal element 120 to control the temperature of the substrate 110 during processing. The thermal element 120 can be, for example, a heater or cooler that is positioned on top of the pedestal 114 or within the pedestal. The heater or cooler can be a separate component that is coupled to the top of the pedestal 114 or can be an integral part of the pedestal 114. In some embodiments, the thermal element 120 is embedded within the pedestal body (as shown in FIGS. 1 and 2). In one or more embodiment, the embedded thermal element 120 may be a heating or cooling element or channel, utilized to apply thermal energy to the pedestal 114 body that is absorbed by the substrate 110. Other elements may be disposed on or embedded within the pedestal 114, such as one or more electrodes, sensors and/or vacuum ports. The temperature of the substrate 110 may be monitored by one or more sensors (not shown). The embedded thermal element 120 may be zone controlled such that temperature at different areas of the pedestal 114 body may be individually heated or cooled. However, due to extenuating factors, such as imperfections in the pedestal 114 and/or non-uniformities in the substrate 110, the embedded thermal element 120 may not be able to apply thermal energy uniformly across the entire support surface 118 and/or the substrate 110. These extenuating factors can create non-uniform temperature distribution across the substrate 110, which can result in non-uniform processing of the substrate.

The pedestal 114 can be coupled to an actuator 126 via shaft 121 that provides one or more of vertical movement (in the z-axis), rotational movement (about axis A) and may also provide angular movement (relative to axis A). Vertical movement may be provided by the actuator 126 to allow the substrate 110 to be transferred between the upper edge ring 116 and the support surface 118. The shaft 121 passes through the bottom 105 of the processing chamber 100 via opening 127. An isolated processing environment can be preserved by bellows 154 surrounding opening 127 and connected to a portion of the shaft 121.

In the processing position, as shown in FIG. 1, the upper edge ring 116 would be in proximity to the pedestal 114 and may circumscribe (i.e., surround) the pedestal 114 such that a lower surface of the substrate 110 would be supported by the pedestal 114. In the processing position, the upper edge ring 116 may be in contact with the pedestal 114 and/or the thermal element 120. In the embodiment shown, where the thermal element 120 is a separate component, the upper edge ring 116 is shown supported by a peripheral shoulder 122 formed around the circumference of the thermal element 120. Those skilled in the art will understand that this is merely representative of one possible configuration and should not be taken as limiting the scope of the disclosure. In some embodiments, the pedestal 114 has the thermal element 120 embedded within and the upper edge ring 116 can be supported on a peripheral shoulder 122 formed around the circumference of the pedestal 114.

The upper edge ring 116 can function as a temporary substrate support during processing. The upper edge ring 116 may be utilized for supporting the substrate 110 in a spaced-apart relation to the support surface 118 of the pedestal 114 as necessary (as shown in FIG. 2), which may facilitate repositioning of the substrate 110 relative to the support surface 118 of the pedestal 114. The upper edge ring 116 may include recesses or slots formed therein that are sized to allow a robot blade 109 to facilitate robotic substrate transfer into and out of the process volume 108.

Figure 3A:
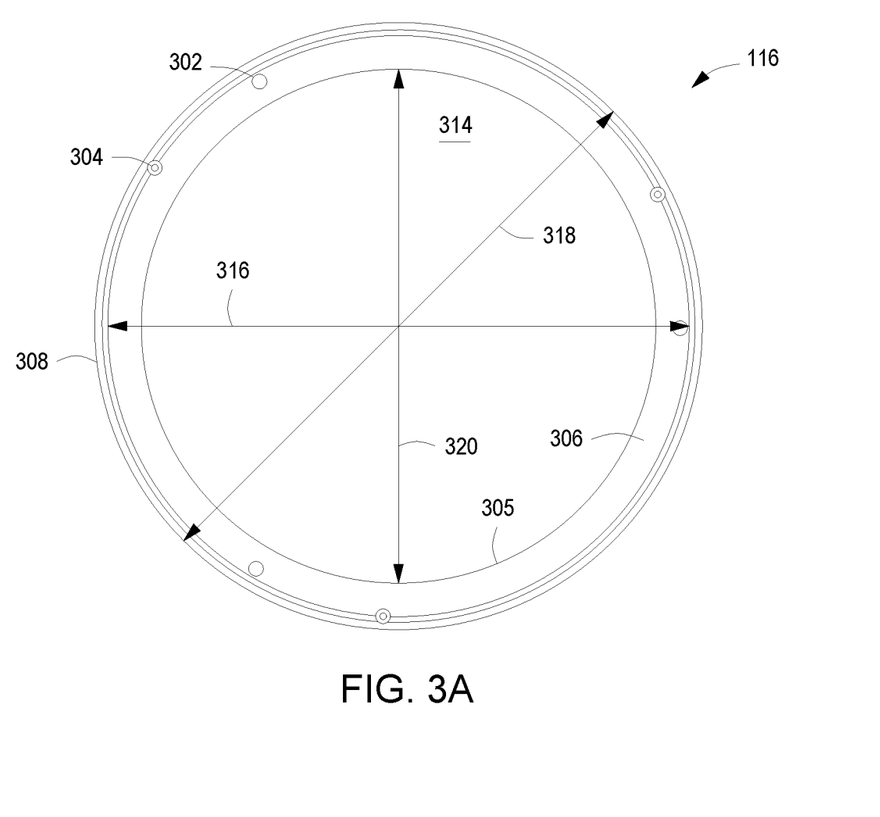
FIG. 3A depicts a bottom view of the upper edge ring in accordance with one or more embodiment of the disclosure.
Figure 3B:
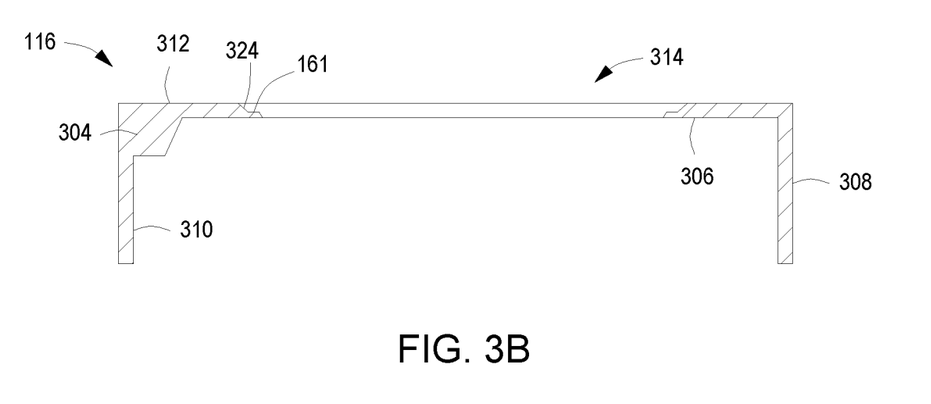
FIG. 3B depicts a side cross-sectional view of the upper edge ring in accordance with one or more embodiment of the disclosure.

Details of the upper edge ring 116 are described below with respect to FIGS. 3A-3B. Specifically, FIG. 3A depicts a bottom view of the upper edge ring 116, FIG. 3B depicts a side cross-sectional view of the upper edge ring 116, and the upper edge ring 116 includes and annular body 322 having a central opening 314. The upper edge ring 116 includes a top ledge 305 having a bottom surface 306 and a top surface 312. The upper edge ring 116 further includes a lower skirt 308 that hangs below the upper ledge and having an inner surface 310. The lower skirt 308 covers the heater 114/120 at the edge to prevent heat loss from the heater. In some embodiments the height of the lower skirt 308 may be about 1 inch to about 3 inches. In some embodiments, the upper edge ring 116 has an inner diameter 316 of about 12 inches to about 15 inches and an outer diameter 318 of about 12.5 inches to about 15.5 inches. In some embodiments, the inner diameter 320 of the top ledge central opening is about 10.5 inches to about 13.5 inches.

The upper edge ring 116 includes one or more features as shown in FIGS. 3A-3B. In some embodiments, the upper edge ring 116 includes one or more top features 324 at the inner diameter 320 of the top ledge. In some embodiments, the top feature 324 may be an annular angled edge such that a gap of about 15 mils to about 25 mils (e.g., a 20 mils gap±5 mils) between the substrate and the upper edge ring 116 is maintained to facilitate heater edge gas purging and prevent chemical deposition at the sides.

In some embodiments, the upper edge ring 116 includes one or more alignment holes 302. The alignment holes 302 facilitate alignment of the upper edge ring 116 with the shadow ring 182 when the heater moves to a processing position. In some embodiments, there may be three alignment holes 302 spaced equidistantly (e.g., 120 degrees) apart. In some embodiments, alignment holes 302 may be oval in shape. In some embodiments, alignment holes 302 may have a chamfered opening. In some embodiments, alignment holes 302 may have an opening between about 0.1 inches to about 0.5 inches.

In some embodiments, the upper edge ring 116 includes one or more alignment tabs 304 that extend downward from the lower surface 306 of the top ledge 305. The alignment tabs 304 facilitate alignment of the upper edge ring 116 with the lower edge ring 180 during in-chamber heater rotation. In some embodiments, there may be three alignment tabs 304 spaced equidistantly (e.g., 120 degrees) apart. In some embodiments, alignment tabs 304 may extend downward from the lower surface 306 of the top ledge 305 by about 0.1 inches to about 0.2 inches.

Figure 4A:
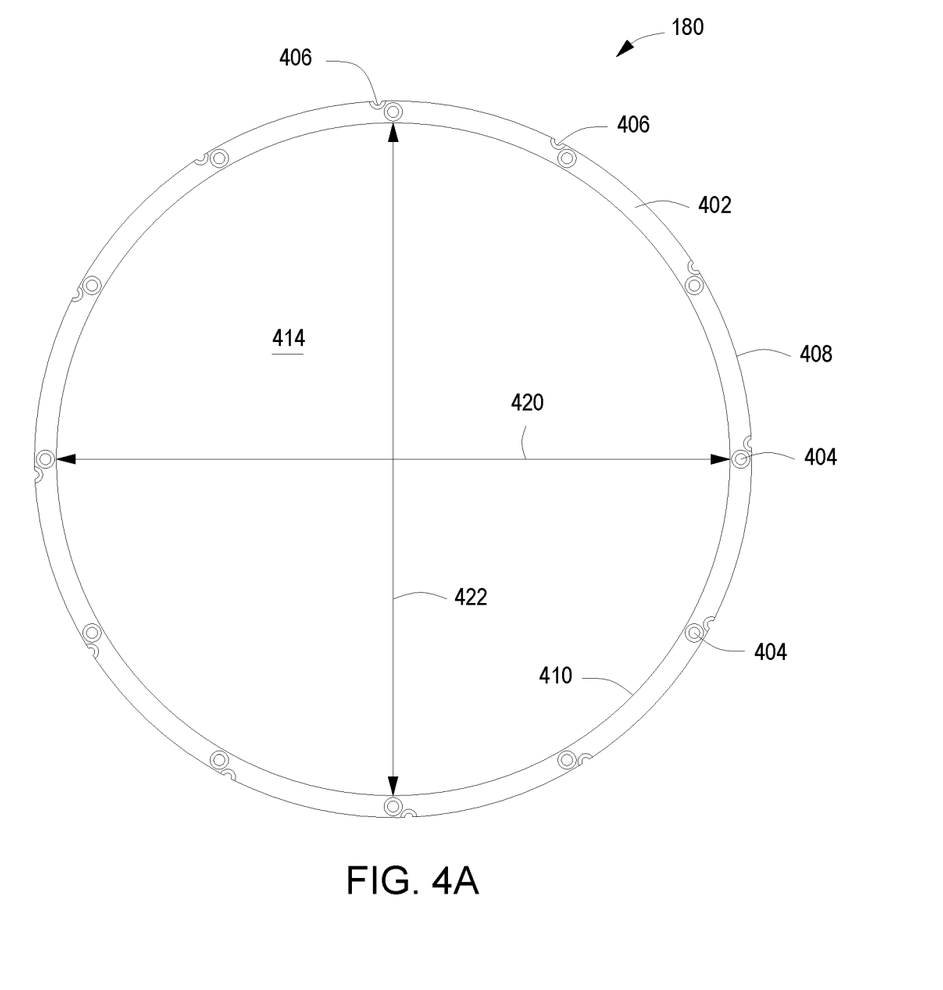
FIG. 4A depicts a top view of the lower edge ring in accordance with one or more embodiment of the disclosure.
Figure 4B:
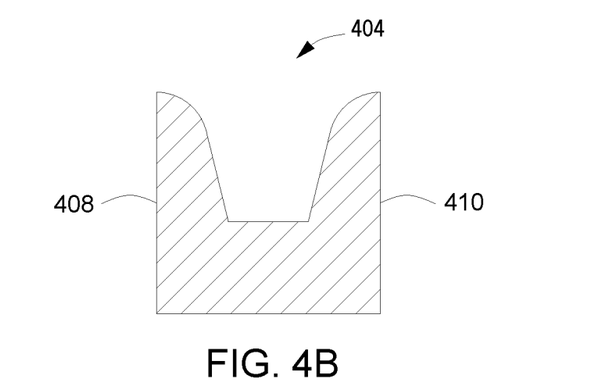
FIG. 4B depicts a side cross-sectional view of an alignment cone cutout in accordance with one or more embodiment of the disclosure.
Figure 4C:
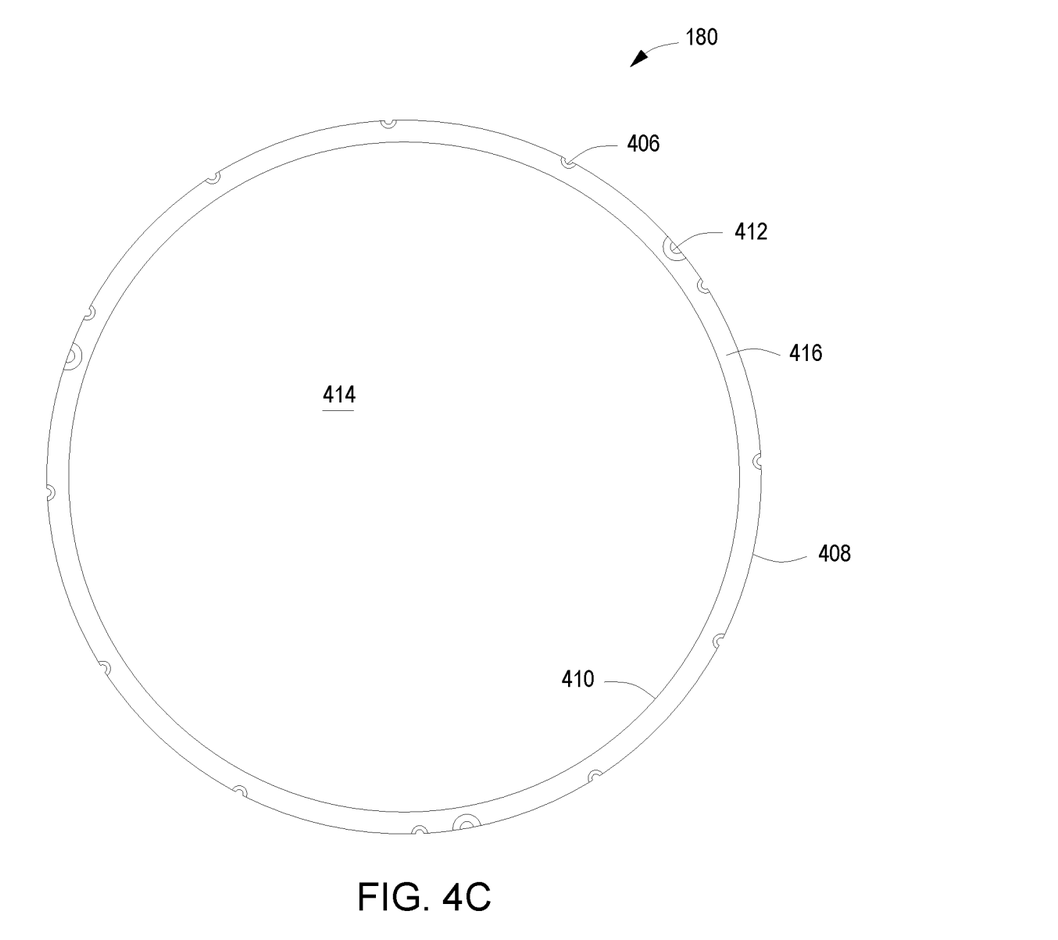
FIG. 4C depicts bottom view of the lower edge ring in accordance with one or more embodiment of the disclosure.

The lower edge ring 180 is disposed below the upper edge ring 116 and facilitates alignment and support of the upper edge ring 116, among other things. Details of the lower edge ring 180 are described below with respect to FIGS. 4A-4O. Specifically, FIG. 4A depicts a top view of the lower edge ring 180, FIG. 4B depicts a side cross-sectional view of an alignment cone cutout 404, and FIG. 4C depicts bottom view of the lower edge ring 180. The lower edge ring 180 includes an annular body 402 having a central opening 414 and an inner surface 410. In some embodiments, the lower edge ring 180 has an inner diameter 422 of about 11 inches to about 14 inches and an outer diameter 420 of about 12 inches to about 15 inches.

The lower edge ring 180 includes one or more features as shown in FIGS. 4A-4C. In some embodiments, the lower edge ring 180 includes a plurality of cone cut outs 404 disposed on a top surface of the lower edge ring 180. The plurality of cone cut outs 404 enable the shadow ring 182 having a lower purge ring to align a substrate notch cover of the shadow ring 182 to be disposed over or otherwise cover the substrate notch during processing. In some embodiments, there may be 12 cone cut outs 404 spaced equidistantly (e.g., 30 degrees) apart. FIG. 4B depicts a side cross-sectional view of a cone cut out 404. In some embodiments, each cone cut out 404 may be about 0.1 to about 0.15 inches deep.

In some embodiments, the lower edge ring 180 includes a plurality of angled cut outs 406 formed along the outer periphery/diameter of the lower edge ring 180. The plurality of angled cut outs 406 facilitate alignment of the lower edge ring 180 with the upper edge ring 116 during in-chamber heater rotation. In some embodiments, there may be 12 angled cut outs 406 spaced equidistantly (e.g., 30 degrees) apart.

In some embodiments, the lower edge ring 180 includes a plurality of bottom alignment tabs 412 formed on a bottom surface of the lower edge ring 180. The plurality of bottom alignment tabs 412 facilitate alignment of the lower edge ring 180 with the heater pedestal 114/120. In some embodiments, there may be 3 bottom alignment tabs 412 spaced equidistantly (e.g., 120 degrees) apart.

Referring to FIG. 2, an exemplary process kit is shown using an apparatus in accordance with one or more embodiments of the disclosure. When loading or unloading a substrate 110, the substrate 110 is supported by a set of lift pins 152. While two lift pins 152 are shown in FIG. 1, those skilled in the art will understand that there are generally three or more lift pins 152 to support the substrate 110.

The substrate 110 is brought into the process volume 108 by robot 109 through port 112 in the sidewall 103 of the process chamber 100. The port 112 can be, for example, a slit valve. A set of lift pins 152 are raised into the loading/unloading position shown in FIG. 2 and the substrate 110 is positioned on the lift pins 152. The lift pins 152 can pass through openings in the body of the pedestal 114 and thermal element 120. When not in use, the lift pins 152 can be lowered to be out of the way during processing. The lift pins 152 can be part of a lift pin assembly 156 that is connected to the shaft 121 so that the lift pin assembly 156 rotates with the shaft 121 and remain aligned with the openings in the pedestal 114.

As shown in FIG. 1, the lift pins 152 are lowered, which lowers the substrate 110 onto the upper edge ring 116. The upper edge ring 116 has an inner lip 161, as shown in FIG. 3B, to support an outer peripheral edge of the substrate 110. The upper edge ring 116 is generally ring shaped with a central opening 314 defined by the inner diameter of the ring. The inner lip 161 is formed at the inner diameter of the upper edge ring 116.

The pedestal 114 of some embodiments includes a peripheral shoulder 122 around the outer peripheral edge of the pedestal 114. The peripheral shoulder 122 of some embodiments is sized to fit within the outer diameter 318 of the upper edge ring 116 with a small clearance. For example, the clearance can be less than or equal to about 5 mm, 4 mm, 3 mm, 2 mm, 1 mm or 0.5 mm.

The lip 161 of the upper edge ring 116 in some embodiments is sized to rest on the peripheral shoulder 122 of the pedestal 114 at a level (or height) equal to or lower than support surface 118 of the primary substrate support 113. The difference in heights between the lip 161 and the support surface 118 can be, for example, about 1 mm to about 10 mm, or, for example, about 0.04 inch to about 0.40 inch.

The upper edge ring 116 has a foot 165 to support the upper edge ring 116 when in the lowered position. In some embodiments, the foot 165, including the body of the upper edge ring 116 between the foot and lip 161, is sized to support the edge ring above the pedestal 114 when the pedestal is in the decoupled position. In one or more embodiments, there is a bottom plate 169 located within the process chamber 100. The bottom plate 169 can be arranged and sized to contact the foot 165 of the edge ring 116 to stop the downward movement of the upper edge ring 116. The size of the bottom plate 169 can be adjusted to change the lowest height that the lip 161 of the upper edge ring 116 can be adjusted.

The bottom plate 169 can be positioned in any suitable location depending on, for example, the components of the process chamber, the size of the edge ring and the position of the lip at the lowest height. In some embodiments, the bottom plate 169 is positioned adjacent to the bottom 105 of the process chamber 100. In some embodiments, the process chamber includes a reflector to reflect radiant energy toward the pedestal 114 or upper edge ring 116. In one or more embodiments, the bottom plate 169 is the same component as the reflector.

Figure 5:
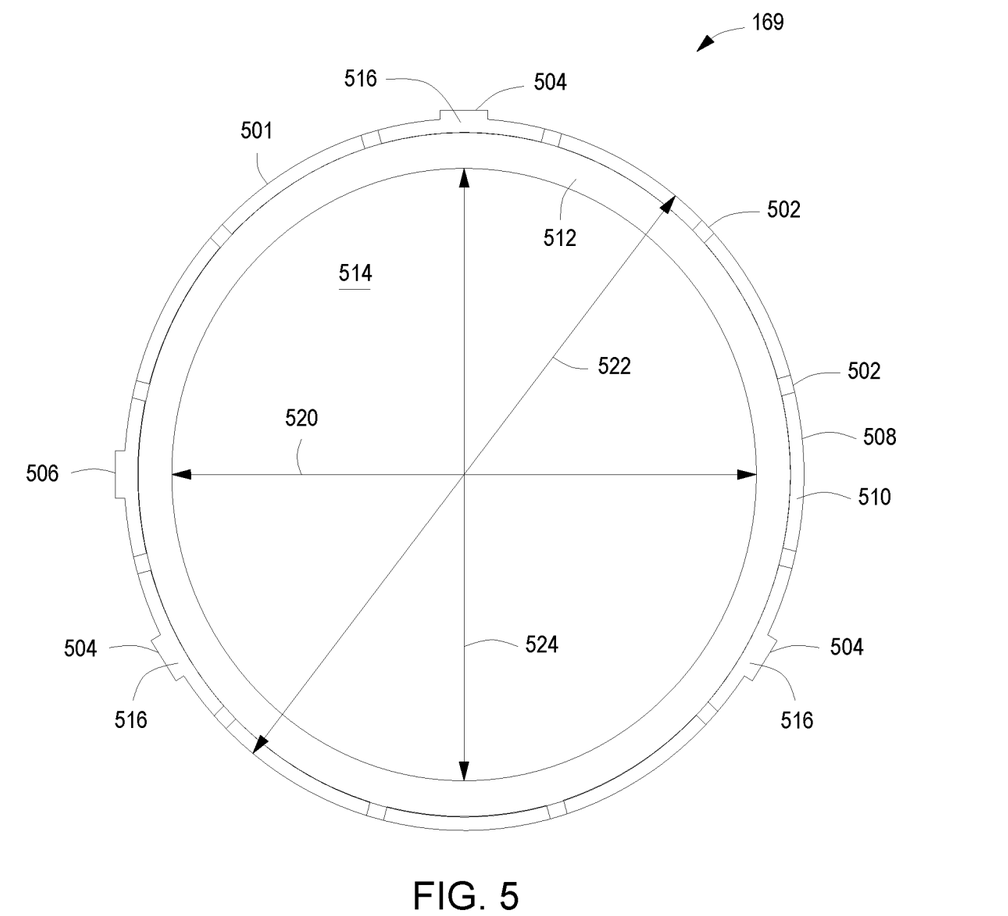
FIG. 5 depicts a top view of the bottom plate ring in accordance with one or more embodiment of the disclosure.

Details of the bottom plate 169 are described with respect to FIG. 5 which depicts a top view of the bottom plate 169. The bottom plate 169 includes and annular body 501 having a central opening 514. The bottom plate 169 includes a bottom ledge 512. In some embodiments, the bottom plate 169 has an inner diameter 520 of about 12.0 inches to about 15.0 inches and an outer diameter 522 of about 12.5 inches to about 15.5 inches. In some embodiments, the inner diameter 524 of the bottom ledge 512 central opening is about 10.5 inches to about 13.5 inches.

In some embodiments, the bottom plate 169 includes one or more features as shown in FIG. 5. In some embodiments, the bottom plate 169 includes one or more centering tabs 504 that jut out along a periphery of the outer diameter of the bottom plate 169. In some embodiments, there may be 3 centering tabs 504 spaced equidistantly (e.g., 120 degrees) apart. The centering tabs 504 facilitate alignment/centering of the bottom plate with respect to the chamber body. The top surface of each of the plurality of centering tabs may function as a landing pad 516. The landing pads 516 are used to contact and support the upper edge ring 116 during substrate decoupling with minimum heat loss from the upper edge ring 116. Thus, the landing pads 516 may be formed of a material or coating that minimizes heat loss from the upper edge ring 116 when in contact.

In some embodiments, the bottom plate 169 includes a plurality of angled cut outs 502, similar to angled cut outs 406, formed along the outer periphery/diameter of the bottom plate 169. The plurality of angled cut outs 502 provide clearance and enable quick pressure equalization between a top section and a bottom section of the chamber during in-chamber heater rotation. In some embodiments, there may be 12 angled cut outs 502 spaced equidistantly (e.g., 30 degrees) apart.

In some embodiments, one or more alignment tabs 506 may be formed along the outer periphery/diameter of the bottom plate 169 to align the bottom plate, for example, with a pumping liner.

Figure 6A:
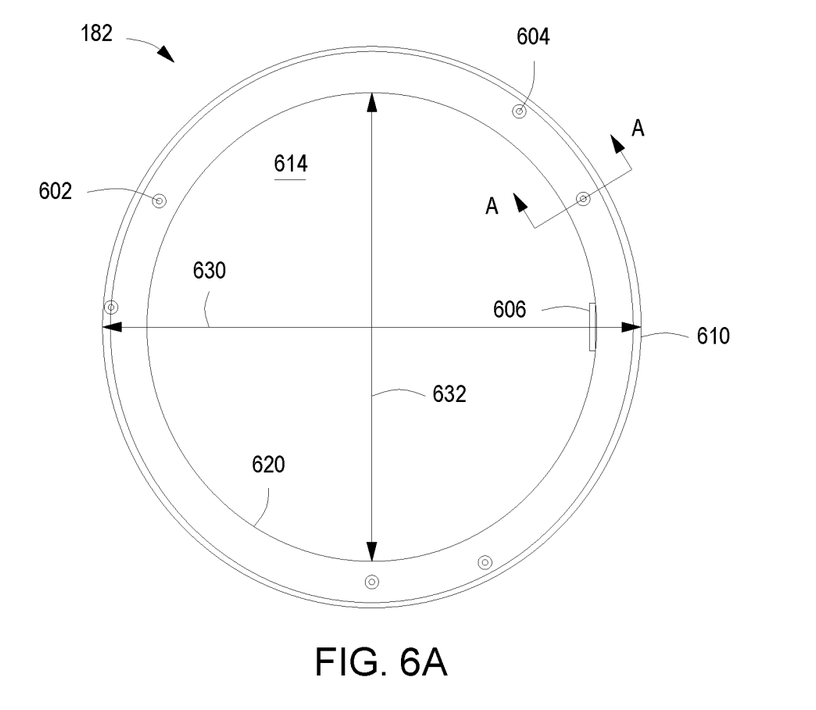
FIG. 6A depicts a bottom view of the shadow ring in accordance with one or more embodiment of the disclosure.
Figure 6B:
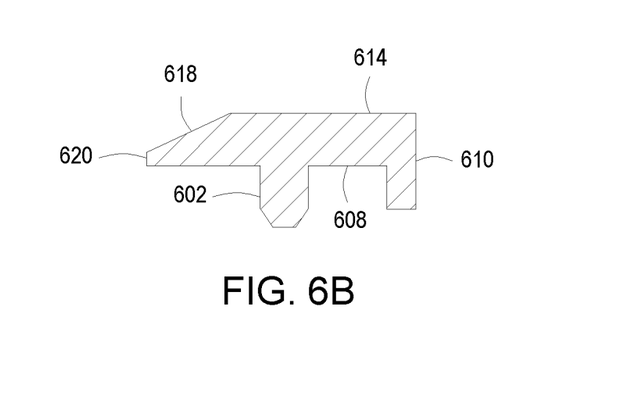
FIG. 6B depicts a side cross-sectional view of the shadow ring.

The aforementioned shadow ring 182 is described in detail with respect to FIGS. 6A and 6B. Specifically, FIG. 6A depicts a bottom view of the shadow ring 182. The shadow ring 182 includes an annular body 610 having a lower surface 608 and a central opening 614. In some embodiments, the shadow ring 182 has an inner diameter 632 of about 10 inches to about 13 inches and an outer diameter 630 of about 12.5 inches to about 15.5 inches.

The shadow ring 182 includes one or more features as shown in FIGS. 3A-3B. In some embodiments, the shadow ring 182 includes one or more top features 620 at the inner diameter 632 of the annular body 610. In some embodiments, the top feature 620 may be an annular angled edge 618.

In some embodiments, the shadow ring 182 includes one or more alignment pins 602 that extend downward from the lower surface 608. The alignment pins 602 facilitate alignment of the shadow ring 182 with the upper edge ring 116 when moving the heater pedestal 114 to a substrate processing position. In some embodiments, there may be three alignment pins 602 spaced equidistantly (e.g., 120 degrees) apart. In some embodiments, alignment pins 602 may extend downward from the lower surface 608 by about 0.1 inches to about 0.5 inches.

In some embodiments, the shadow ring 182 includes one or more alignment tabs 604 that extend downward from the lower surface 608. The alignment tabs 604 facilitate alignment of the shadow ring 182 with the pumping liner, for example, during decoupling of the heater pedestal 114 from the shadow ring 182. In some embodiments, there may be three alignment tabs 604 spaced equidistantly (e.g., 120 degrees) apart. In some embodiments, alignment tabs 604 may extend downward from the lower surface 608 by about 0.1 inches to about 0.3 inches.

In some embodiments, the shadow ring 182 includes one or more notch cover features 606 that extend inward from the inner diameter 632 edge. The notch cover 606 covers the substrate notch during processing to prevent deposition on the heater pedestal 114 through the notch opening.

Referring back to FIGS. 1 and 2, in embodiments consistent with the present disclosure, the primary substrate support 113 is raised so that the support surface 118 contacts the bottom side of the substrate 110, thermally coupling the support surface 118 and the substrate 110. During lifting of the primary substrate support 113, the lip 161 of the edge ring contacts the peripheral shoulder 122 of the pedestal 114. The upper edge ring 116 is movable in a vertical direction (z-axis) by contact and interaction with the pedestal 114 through the peripheral shoulder 122. In some embodiments, the upper edge ring 116 is movable in the vertical direction (z-axis) only through interaction with the pedestal 114. Stated differently, in some embodiments, the upper edge ring 116 does not have an independent lifting mechanism or actuator.

The primary substrate support 113 is raised high enough that the foot 165 of the upper edge ring 116 ceases contact with the bottom plate 169. The lip of the upper edge ring 116 can be positioned within the peripheral shoulder 122 adjacent the substrate 110 so that the substrate 110 is in substantially full contact with the support surface 118. The lip 161 of the upper edge ring 116 may be slightly lower than the support surface 118 so that there is a small gap. The gap can be minimized based so that there is little or no impact to process uniformity.

The process has been described with the substrate 110 being loaded with the upper edge ring 116 only contacting the substrate when the lift pins 152 are lowered. However, those skilled in the art will understand that this is merely representative of one possible method and should not be taken as limiting the scope of the disclosure. In some embodiments, the primary substrate support 113 is raised or the lift pins 152 are lowered so that the substrate makes contact with the support surface 118 at the same time or before the lip 161 of the upper edge ring 116.

The substrate can be processed while in the coupled position. The process chamber 100 may be a deposition chamber, an etch chamber, an ion implant chamber, a plasma treatment chamber, or a thermal process chamber, among others. In the embodiment shown in FIG. 1, the process chamber is a deposition chamber and includes a showerhead assembly 128. The process volume 108 may be in selective fluid communication with a vacuum system 130 to control pressures therein. The showerhead assembly 128 may be coupled to a process gas source 132 to provide process gases to the process volume 108 for depositing materials onto the substrate 110. The showerhead assembly 128 may also include a temperature control element 134 for controlling the temperature of the showerhead assembly 128. The temperature control element 134 may be a fluid channel that is in fluid communication with a coolant source 136.

To counter the thermal non-uniformity that may be present on the surface of the substrate 110 (which may be determined by monitoring temperature of the substrate 110), the substrate 110 may be repositioned relative to the support surface 118. The hot or cold spots present on the surface of the substrate 110 are indicative of hot or cold spots in or on the support surface 118 of the pedestal body.

After the substrate 110 is processed to some predetermined extent, the primary substrate support 113 is lowered to decouple the support surface 118 from the substrate 110. The decoupling causes the upper edge ring 116 to lower in the process chamber 100 so that the foot 165 contacts the bottom plate 169. The upper edge ring 116 stops moving in the downward direction once the foot 165 rests on the bottom plate 169. With the upper edge ring 116 stopped, further downward movement of the pedestal 114 (and support surface 118) causes the substrate 110 to be supported by the upper edge ring 116 and decoupled from the support surface 118. As the support surface 118 is further lowered, a gap is created between the support surface 118 and the substrate 110. In some embodiments, the upper edge ring 116 is movable with the movement of the primary support substrate 113 and not independently movable.

Once decoupled, the primary substrate support 113 is rotated with actuator 126 by a predetermined amount. After rotation, the decoupled substrate 110 and support surface 118 are re-coupled, moving the primary substrate support 113 upward to a position where the substrate 110 and support surface are 118 touching. This coupling/process/de-coupling/rotation cycle is repeated until the process is completed.

Each rotation of the primary substrate support 113 is by 1/nth of the total amount, where n is one or more of a rotational degree or a fraction of the deposition time. For example, if the n is a rotational degree that is four-fold, the primary substrate support 113 will be rotated 90° about the axis A. The rotational degree is the amount of rotation that occurs in separate steps to equal a complete circle of 360° based on the number of iterations for coupling/processing/de-coupling. If there are twelve coupling/decoupling iterations, each rotation of the primary substrate support 113 will be ¹⁄₁₂ of 360° or 30°.

In some embodiments, n is based on the predetermined deposition time for the process. For example, if a ten minute process had ten iteration of coupling/decoupling, each rotation of the primary substrate support 113 would be 36°, so that a complete circle of 360° is made by the end of the process.

In some embodiments, the coupling/processing/decoupling/rotation iteration occurs a total of Xn times, where n is one or more of a rotational degree or a fraction of the deposition time and X is a positive integer. For example, if the primary substrate support 113 is rotated 90° during each iteration; then n would be 360°/90° or 4 to make a complete circle. The complete circle can be made more than one time so that X is greater than 1. For example, if the primary substrate support 113 is rotated 90° during each iteration and there are a total of eight iterations, then n would be 360°/90°=4 and N would be 2; meaning that two complete revolutions of the primary substrate support 113 occur.

In another embodiment, the pedestal 114 may be an electrostatic chuck and the pedestal 114 may include one or more electrodes 125 (as shown in FIG. 1). For example, the pedestal 114 may be coupled to a power element 140A that may be a voltage source providing power to the one or more electrodes 125. The voltage source may be a radio frequency (RF) controller or a direct current (DC) controller. In another example, the pedestal 114 may be made of a conductive material and function as a ground path for RF power from a power element 140B distributed by the showerhead assembly 128. Thus, the process chamber 100 may perform a deposition or etch process utilizing RF or DC plasmas. As these types of plasmas may not be perfectly concentric or symmetrical, RF or DC hot spots (i.e., electromagnetic hot spots) may be present on the substrate 110. These electromagnetic hot spots may create non-uniform deposition or non-uniform etch rates on the surface of the substrate 110.

While the foregoing is directed to embodiments of the present invention, other and further embodiments of the invention may be devised without departing from the basic scope thereof.

The invention claimed is:

1. A process kit, comprising:
an upper edge ring including an integrally formed top ledge and skirt, wherein the skirt extends downward from the top ledge, wherein the top ledge of the upper edge ring is configured to support a substrate in a spaced-apart relation to a support surface of a substrate support heater pedestal to facilitate repositioning of the substrate relative to a support surface of the substrate support heater pedestal, wherein the skirt covers the outer edges of the substrate support heater pedestal to prevent heat loss from the substrate support heater pedestal, wherein the upper edge ring includes one or more alignment holes, and wherein the upper edge ring includes one or more alignment tabs that extend downward from a lower surface of the top ledge; and
a lower edge ring that at least partially supports the upper edge ring and aligns the upper edge ring with the substrate support heater pedestal when the substrate support heater pedestal is in a raised processing position, wherein the lower edge ring is disposed entirely within the inner diameter of the skirt, wherein the lower edge ring includes a plurality of cone cut outs disposed on a top surface of the lower edge ring, wherein the lower edge ring includes a plurality of angled cut outs formed on an outer diameter of the lower edge ring, wherein the plurality of angled cut outs are spaced equidistantly apart, and wherein the one or more alignment tabs of the upper edge ring are disposed in a corresponding number of the plurality of angled cut outs formed in the lower edge ring when the substrate support heater pedestal is in a raised processing position; and
a shadow ring that couples with the upper edge ring when the substrate support heater pedestal is in a raised processing position, wherein the shadow ring includes one or more alignment pins that extend downward from a lower surface of the shadow ring and through the corresponding one or more alignment holes of the upper edge ring and into the plurality of cone cut outs disposed on the top surface of the lower edge ring, such that the upper edge ring, lower edge ring, and shadow ring are all in alignment when the substrate support heater pedestal is in a raised processing position.

2. A rotatable substrate support heater pedestal and process kit for supporting a substrate in a process chamber, comprising:
- a primary substrate support having a support surface to support the substrate during processing, where the substrate support heater pedestal includes a shaft connected to an actuator to move the substrate support heater pedestal vertically and rotationally about an axis of the shaft; and
- the process kit comprising:
  - an upper edge ring including an integrally formed top ledge and skirt, wherein the skirt extends downward from the top ledge, wherein the top ledge of the upper edge ring is configured to support the substrate in a spaced-apart relation to a support surface of the substrate support heater pedestal to facilitate repositioning of the substrate relative to the support surface of the substrate support heater pedestal, wherein the upper edge ring includes one or more alignment holes, and wherein the upper edge ring includes one or more alignment tabs that extend downward from a lower surface of the top ledge; and
  - a lower edge ring that at least partially supports the upper edge ring and aligns the upper edge ring with the substrate support heater pedestal when the substrate support heater pedestal is in a raised processing position, wherein the lower edge ring is disposed entirely within the inner diameter of the skirt, wherein the lower edge ring includes a plurality of cone cut outs disposed on a top surface of the lower edge ring, wherein the lower edge ring includes a plurality of angled cut outs formed on an outer diameter of the lower edge ring, wherein the plurality of angled cut outs are spaced equidistantly apart, and wherein the one or more alignment tabs of the upper edge are disposed in a corresponding number of the plurality of angled cut outs formed in the lower edge ring when the substrate support heater pedestal is in a raised processing position; and
  - a shadow ring that couples with the upper edge ring when the substrate support heater pedestal is in a raised processing position, wherein the shadow ring includes one or more alignment pins that extend downward from a lower surface of the shadow ring and through the corresponding one or more alignment holes of the upper edge ring and into the plurality of cone cut outs disposed on the top surface of the lower edge ring, such that the upper edge ring, lower edge ring, and shadow ring are all in alignment when the substrate support heater pedestal is in a raised processing position.

3. The rotatable substrate support heater pedestal and process kit of claim 2, wherein the process kit further includes:
- a bottom plate disposed on a bottom of the process chamber that supports the upper edge ring when the substrate support heater pedestal is in a lowered non-processing position.

4. A process kit for use with a rotatable substrate support heater pedestal for supporting a substrate in a process chamber, comprising:
- an upper edge ring including an integrally formed top ledge and skirt, wherein the skirt extends downward from the top ledge, and wherein the upper edge ring includes one or more alignment holes;
- a lower edge ring that at least partially supports the upper edge ring and aligns the upper edge ring with the substrate support heater pedestal when the substrate support heater pedestal is in a raised processing position, wherein the lower edge ring is disposed entirely within the inner diameter of the skirt, and wherein the lower edge ring includes a plurality of cone cut outs disposed on a top surface of the lower edge ring;
- a bottom plate disposed on a bottom of the process chamber that supports the upper edge ring when the substrate support heater pedestal is in a lowered non-processing position; and
- a shadow ring that couples with the upper edge ring when the substrate support heater pedestal is in a raised processing position, wherein the shadow ring includes one or more alignment pins that extend downward from a lower surface of the shadow ring and through the corresponding one or more alignment holes of the upper edge ring and into the plurality of cone cut outs disposed on the top surface of the lower edge ring, such that the upper edge ring, lower edge ring, and shadow ring are all in alignment when the substrate support heater pedestal is in a raised processing position.

5. The process kit of claim 4, wherein the upper edge ring surrounds the substrate support heater pedestal.

6. The process kit of claim 4, wherein the top ledge of the upper edge ring is configured to support the substrate in a spaced-apart relation to a support surface of the substrate support heater pedestal to facilitate repositioning of the substrate relative to the support surface of the substrate support heater pedestal.

7. The process kit of claim 4, wherein the skirt covers the outer edges of the substrate support heater pedestal to prevent heat loss from the substrate support heater pedestal.

8. The process kit of claim 4, wherein a height of the skirt is about 1 inch to about 3 inches.

9. The process kit of claim 4, wherein the skirt of the upper edge ring has an inner diameter of about 12 inches to about 15 inches and an outer diameter of about 12.5 inches to about 15.5 inches, and wherein an inner diameter of the top ledge central opening is about 10.5 inches to about 13.5 inches.

10. The process kit of claim 4, wherein the top ledge of the upper edge ring includes an inner lip to support an outer peripheral edge of the substrate.

11. The process kit of claim 4, wherein the upper edge ring includes one or more top features at the inner diameter of the top ledge, and wherein the top feature is an annular angled edge such that a gap of about 15 mils to about 25 mils between the substrate and the upper edge ring is maintained to facilitate heater edge gas purging.

12. The process kit of claim 4, wherein the upper edge ring includes one or more alignment tabs that extend downward from a lower surface of the top ledge to facilitate alignment of the upper edge ring with the lower edge ring.

13. The process kit of claim 4, wherein the lower edge ring includes an annular body having a central opening and an inner surface, and wherein the lower edge ring has an inner diameter of about 11 inches to about 14 inches and an outer diameter of about 12 inches to about 15 inches.

14. The process kit of claim 4, wherein the lower edge ring includes a plurality of cone cut outs disposed on a top surface of the lower edge ring to facilitate alignment of the shadow ring, and wherein the plurality of cone cut outs are spaced equidistantly apart.

15. The process kit of claim 12, wherein the lower edge ring includes a plurality of angled cut outs formed along on an outer diameter of the lower edge ring that facilitate alignment of the lower edge ring with the upper edge ring during in-chamber heater rotation, and wherein the plurality of angled cut outs are spaced equidistantly apart.

16. The process kit of claim 4, wherein the lower edge ring includes a plurality of bottom alignment tabs formed on a bottom surface of the lower edge ring to facilitate alignment of the lower edge ring with the substrate support heater pedestal.

17. The process kit of claim 4, wherein the upper edge ring includes a foot at the bottom of the skirt, and wherein the bottom plate contacts the foot of the upper edge ring to stop a downward movement of the upper edge ring when the substrate support heater pedestal is in a lowered non-processing position.

18. The process kit of claim 4, wherein the bottom plate includes one or more centering tabs that jut out along a periphery of an outer diameter of the bottom plate to facilitate centering of the bottom plate with respect to the process chamber body.

19. The process kit of claim 4, wherein the bottom plate is also a reflector to reflect radiant energy toward the substrate support heater pedestal and/or upper edge ring.

20. The process kit of claim 4, wherein the shadow ring further includes one or more alignment tabs that extend downward from a lower surface of the shadow ring.

* * * * *

UNITED STATES PATENT AND TRADEMARK OFFICE
CERTIFICATE OF CORRECTION

PATENT NO. : 10,704,147 B2
APPLICATION NO. : 15/421964
DATED : July 7, 2020
INVENTOR(S) : Muhammad M. Rasheed Page 1 of 1

It is certified that error appears in the above-identified patent and that said Letters Patent is hereby corrected as shown below:

In the Specification

Column 5, in Line 43, delete "FIGS. 4A-40." and replace with "FIGS. 4A-4C."

In the Claims

Column 12, in Line 65, Claim 15 delete "along on" and replace with "on"

Signed and Sealed this
Tenth Day of November, 2020

Andrei Iancu
*Director of the United States Patent and Trademark Office*